US008546830B2

(12) United States Patent
Abramov et al.

(10) Patent No.: US 8,546,830 B2
(45) Date of Patent: *Oct. 1, 2013

(54) METHOD OF GROWING SEMICONDUCTOR HETEROSTRUCTURES BASED ON GALLIUM NITRIDE

(75) Inventors: Vladimir Semenovich Abramov, Moscow (RU); Naum Petrovich Soshchin, Fryazino (RU); Valeriy Petrovich Sushkov, Moscow (RU); Nikolay Valentinovich Shcherbakov, Moscow (RU); Vladimir Vladimirovich Alenkov, Podolsk (RU); Sergei Aleksandrovich Sakharov, Moscow (RU); Vladimir Aleksandrovich Gorbylev, Moscow (RU)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/444,429

(22) Filed: Apr. 11, 2012

(65) Prior Publication Data

US 2013/0099244 A1 Apr. 25, 2013

Related U.S. Application Data

(63) Continuation of application No. 13/182,867, filed on Jul. 14, 2011, now Pat. No. 8,174,042, which is a continuation of application No. 12/278,208, filed as application No. PCT/RU2007/000055 on Feb. 6, 2007, now Pat. No. 7,998,773.

(30) Foreign Application Priority Data

Feb. 6, 2006 (RU) ................................ 2006103270

(51) Int. Cl.
*H01L 33/00* (2010.01)
(52) U.S. Cl.
USPC .......... 257/98; 257/94; 257/103; 257/E33.061
(58) Field of Classification Search
USPC ................................ 257/94, 103, E33.061, 98
See application file for complete search history.

(56) References Cited

U.S. PATENT DOCUMENTS 5,290,393 A 3/1994 Nakamura
5,909,036 A 6/1999 Tanaka et al.
(Continued)

FOREIGN PATENT DOCUMENTS

| JP | 9-221392 | 8/1997 |
| JP | 11-261367 | 9/1999 |
| JP | 2002-270516 | 9/2002 |
| JP | 2004-075890 | 3/2004 |
| JP | 2005-119921 | 5/2005 |
| JP | 2005-286338 | 10/2005 |
| JP | 2005-354027 | 12/2005 |
| RU | 2233013 C2 | 7/2004 |
| SU | 635813 | 8/1978 |
| WO | 03-089696 | 10/2003 |
| WO | 2005-073342 | 8/2005 |

OTHER PUBLICATIONS

Supplemental Notice of Allowance of U.S. Appl. No. 12/278,208 issued on May 25, 2011.
Notice of Allowance issued on Jan. 12, 2012 in U.S. Appl. No. 13/182,867.
International Search Report for PCT/RU2007/000055 issued on Jul. 27, 2007.
Non-Final Office Action of U.S. Appl. No. 12/278,208 issued on Aug. 9, 2010.
Final Office Action of U.S. Appl. No. 12/278,208 issued on Jan. 6, 2011.
Notice of Allowance of U.S. Appl. No. 12/278,208 issued on Apr. 18, 2011.
First Office Action of Chinese Patent Application No. 200780004671 issued on Feb. 24, 2011 corresponding to U.S. Appl. No. 12/278,208.

*Primary Examiner* — Zandra Smith
*Assistant Examiner* — Jamie C Niesz
(74) *Attorney, Agent, or Firm* — H.C. Park & Associates, PLC

(57) ABSTRACT

The method of growing non-polar epitaxial heterostructures for light-emitting diodes producing white emission and lasers, on the basis of compounds and alloys in AlGaInN system, comprising the step of vapor-phase deposition of one or multiple heterostructures layers described by the formula $Al_xGa_{1-x}N$ ($0<x\le1$), wherein the step of growing $A^3N$ structures using (a)-langasite ($La_3Ga_5SiO_{14}$) substrates is applied for the purposes of reducing the density of defects and mechanical stresses in heterostructures.

12 Claims, 4 Drawing Sheets

(56) References Cited

U.S. PATENT DOCUMENTS

| | | |
|---|---|---|
| 5,993,542 A | 11/1999 | Yanashima et al. |
| 5,998,925 A | 12/1999 | Shimizu et al. |
| 6,069,440 A | 5/2000 | Shimizu et al. |
| 2004/0206967 A1 | 10/2004 | Oshima et al. |
| 2005/0214992 A1* | 9/2005 | Chakraborty et al. ........ 438/172 |
| 2007/0158660 A1* | 7/2007 | Abramov et al. ................ 257/79 |

* cited by examiner

METHOD OF GROWING SEMICONDUCTOR HETEROSTRUCTURES BASED ON GALLIUM NITRIDE

CROSS REFERENCE TO RELATED APPLICATIONS

The present application is a continuation of U.S. patent application Ser. No. 13/182,867, filed on Jul. 14, 2011, which is a continuation of U.S. patent application Ser. No. 12/278, 208, filed on Aug. 4, 2008, now U.S. Pat. No. 7,998,773, which is the National Stage Entry of International Application No. PCT/RU2007/000055, filed on Feb. 6, 2007, and claims priority from Russian Patent Application No. 2006103270, filed on Feb. 6, 2006, which are hereby incorporated by reference for all purposes as if fully set forth herein.

BACKGROUND OF THE INVENTION

1. Field of the Invention

The invention is related to methods of manufacturing of semiconductor materials and devices, and more particularly, to manufacturing non-polar epitaxial heterostructures of third group elements nitrides (further $A^3N$ structures) by Organometallic Vapor-Phase Epitaxy (further OMVPE) which are usually used for such devices, as lasers, light emitting diodes (LEDs), and particularly, white LEDs.

2. Discussion of the Background $A^3N$ semiconductor heterostructures are basic materials for design and manufacture of high efficient light emitting diodes and lasers in visible and ultraviolet parts of optical spectrum of radiation, including white LEDs.

In the reference [1] use of converting dark blue and/or ultra-violet radiation of GaN-mis structures into longer wavelength radiation in visible part of spectrum with the help of covering these structures by stocks phosphors was offered for the first time.

In the reference [2] design of white light emitting diodes on the basis of dark blue p-n AlGaInN heterostructure emitters covered by Yttrium-Aluminum-Garnet phosphor has been offered. Part of the primary dark blue radiation of emitters is converted into yellow radiation of phosphor. As a result, mixing of blue radiation from an emitter and complementary yellow luminescence exited by the blue radiation in phosphor produce white light by LEDs with certain coordinates of chromaticity.

Three basic designs of white light-emitting diodes essentially differing from each other are known:
  light-emitting diodes on the basis of an emitter of dark blue color of luminescence which is covered by a layer of stocks phosphor converting a part of dark blue radiation into yellow radiation;
  light-emitting diodes on the basis of an emitter of ultraviolet radiation which is covered by a layer of stocks phosphor converting ultraviolet radiation into red, green and dark blue bands of luminescence (RGB system);
  full-color light-emitting diodes containing three separate emitters radiating in red, green and dark blue parts of spectrum (RGB system).

Despite of distinction, improvement of parameters of all listed types of white light-emitting diodes demands perfection of methods of epitaxial $A^3N$-heterostructures growth and increase of quantum output of radiation of phosphors.

For mass production of light emitting diodes the most preferable method of manufacturing $A^3N$-heterostructures is the method of Organometallic Vapor-Phase Epitaxy (OMVPE).

Sapphire ($Al_2O_3$), silicon carbide (6H—SiC), gallium nitride (GaN) and aluminum nitride (AlN) are used as substrates for $A^3N$ epitaxial structures growth. Cheaper sapphire substrates are most of all used. Silicon carbide substrates in some times more expensive than sapphire ones and, therefore, are used not so often. Close to ideal there could be substrates made of GaN or AlN, but their mass production is not achieved yet. Typical $A^3N$-heterostructures for light-emitting diodes contain following functional parts:
  a single crystal substrate of sapphire or silicon carbide which surface is crystallographic c-plane (0001) defining crystallographic type of $A^3N$ epitaxial layers, for example, wurtzite type of their crystal structures and azimuthally orientation of crystallographic lattices;
  wide-bandgap emitters, as a rule, n-type and p-type $Al_xGa_{1-x}N$ layers providing effective injection of electrons and holes and their confinement in active region of the heterostructure;
  an active region containing, as a rule, a set of narrow-bandgap layers of such materials, as $In_xGa_{1-x}N$ alloys which are usually not specially doped;
  contact epitaxial GaN layers of n-type and p-type conductivity providing low specific resistance of ohmic contacts and uniform distribution of current density in a cross-section of a device.

In $A^3N$-epitaxial heterostructures used in various devices, in particular in light-emitting diodes and lasers, density of defects (dislocations, defects of packing, etc.) and also a level of mechanical stresses should be as low, as possible. For example, GaAs laser heterostructures usually have dislocation density not exceeding values of $10^2$-$10^3$ cm$^{-2}$. In $A^3N$-heterostructures basically exists two sources of defects, first of which concerns to a difference of lattice parameters of a substrate and $A^3N$ epitaxial layers and second one concerns to a mismatch of lattice parameters of layers inside of a heterostructure, for example, between GaN and $Al_xGa_{1-x}N$ layers or between GaN and $In_xGa_{1-x}N$ layers. In the case of GaN or AlN substrates the contribution of the first defects source is decreasing and is comparable with the second defects source contribution.

$A^3N$ single-crystal epitaxial layers which have wurtzite type of crystal structure: AlN (lattice parameter a=0.311 nm), GaN (a=0.316 nm) and InN (a=0.354 nm), grown on single-crystal $Al_2O_3$ substrates oriented in (0001)-plane (the oxygen sublattice parameter a=0.275 nm) or on 6H—SiC substrates (a=0.308 nm), always contain high density of defects, basically dislocations.

Dislocations are formed in interface "substrate-epitaxial layer" because there is an essential difference of lattice parameters of a substrate and a epitaxial layer. Lattice parameters of epitaxial layers are larger than a lattice parameter of a substrate (discrepancy up to 16%) and dislocations will spread through heterostructure layers. In typical AlGaInN heterostructures used in blue and green light-emitting diodes, which have been grown on sapphire substrates, dislocation densities may have values $10^8$-$10^{10}$ cm$^{-2}$. For similar heterostructures grown on SiC substrates dislocation densities may have values $10^7$-$10^9$ cm$^{-2}$. Thus, the contribution of the first source of defects is defined by a value $10^7$-$10^9$ cm$^{-2}$, the contribution of the second source of dislocations formation inside a heterostructure is equal to $10^6$-$10^7$ cm$^{-2}$. In particular, formation of high density of dislocations and even cracking AlGaN layers is caused by a difference of lattice parameters of GaN and AlN layers (discrepancy of 3.5%) and by their differences in thermal expansion coefficient values.

For the partial solution of these problems can be used methods. In first of them before growing a AlGaN layer, for example, n-type emitter layer, a thin $In_{0.1}Ga_{0.9}N$ layer is grown (thickness about 0.1 microns) to prevent cracking a subsequent $Al_xGa_{1-x}N$ (x=0.15-0.20) layer. In the second method instead of a bulk $Al_xGa_{1-x}N$ n-type emitter layer with a constant x-value a strained multiquantum superlattice AlGaN/GaN layer is grown. The thickness of each layer in the superlattice is about 0.25 nm.

A very special feature of Organometallic Vapor-Phase Epitaxy for $A^3N$-heterostructures growth is necessity of abrupt changing temperature of substrates during a technological process. So, at growing a buffer layer (usually a very thin amorphous GaN or AlN layer) the temperature of sapphire or silicon carbide substrates is rapidly decreased from 1050° C.-1100° C. down to 550° C. and after finishing the amorphous GaN or AlN layer growth the substrate temperature is rapidly increased up to the temperature of growth of a single crystalline GaN layer (1050° C.). If process of heating substrates with a buffer GaN or AlN layer is slow, it will lead to crystallization of a thin (about 20 nm) GaN layer and subsequent growing a thick GaN layer leads to formation of a nonplanar film which has great number of defects and figures of growth.

Another necessity of change of substrate temperature during growth is realized at growing $In_xGa_{1-x}N$ layers (at x>0.1) in active region of the heterostructure. These layers have a tendency to thermal decomposition at temperatures above 850° C.-870° C. In this case growing $In_xGa_{1-x}N$ layers is completed at a lower (800° C.-850° C.) temperature. During increasing the substrate temperature up to 1000° C.-1050° C. the process of heterostructure growth should be interrupted by disconnecting submission of metalloorganic Ga, Al and In precursors to substrates. With the purpose to exclude thermal decomposition of $In_xGa_{1-x}N$ layers they are sometimes covered with a thin (~20 nm) protective $Al_{0.2}Ga_{0.8}N$ layer. This layer has sufficient stability to dissociation up to temperatures about 1050° C. Sharp change of temperature of a substrate with deposited epitaxial layers (except during a GaN or AlN buffer GaN layer growing) can lead to additional formation of defects and cracking grown layers, for example, AlGaN layers. Thus, it is desirable to have such methods of $A^3N$-heterostructures growth, in particular structures for super bright light-emitting diodes, which allow smooth change of growth temperatures and exclude interruptions of a growth process at $In_xGa_{1-x}N$ layers growing. These methods of growth have also to reduce density of dislocations generated in interfaces of $A^3N$ heterostructure layers. Reduction of dislocations penetrating into a (0001) heterostructure grown on sapphire or silicon carbide substrates can be achieved by use of special techniques including lateral epitaxial overgrowth (LEO-technology). At first, in this technology a thin buffer GaN layer is usually grown at a low temperature. Then a $SiO_2$ or $Si_3N_4$ film is deposited on the structure surface. In this film narrow long parallel each other windows are etched down to the buffer layer and then, during the next epitaxy process, a thick GaN layer has been grown on $SiO_2$ or $Si_3N_4$ film surface at a high temperature. In the same process a $A^3N$ heterostructure is also grown up. It is easy to see, that the LEO-technology is much more complex and more labour-consuming, than usual technology.

Theoretical and, partially, experimental investigations predict advantage of use non-polar a-plane (further a-$A^3N$) heterostructures in a lot of devices, in particular, in light-emitting diodes and lasers. In comparison with usual polar heterostructures grown along the polar c-direction [0001] in a-$A^3N$ non-polar heterostructures strong electrostatic fields along the direction of growth are absent. Owing to it, spatial separation of injected electrons and holes in the active region of non-polar a-$A^3N$ heterostructures is eliminated and, as consequence, increase of internal quantum efficiencies of radiation in light-emitting diodes and lasers made on their basis can be expected.

A lot of publications is devoted to growth of a-$A^3N$ non-polar heterostructures. In the patent application [3] growth of a-GaN (1120) films on r-plane (1102) sapphire substrates is described. In the publication [4] advanced a-$A^3N$ non-polar hetero structures grown on a-GaN substrates are proposed by Sh. Nakamura.

At last, in the patent application [3] the opportunities of a-$A^3N$ non-polar heterostructures growth on silicon carbide, silicon, zinc oxide, lithium aluminates, lithium niobate and germanium substrates are mentioned.

Thus, a-$A^3N$ non-polar heterostructures growth providing low dislocations and structural defects densities is rather actual direction of technology developments to solve problems of increasing internal quantum efficiencies of light-emitting diodes and lasers and their life-times.

SUMMARY OF THE INVENTION

The subject of this invention is a new method of growing non-polar a-$A^3N$ epitaxial homo- and/or heterostructures on the basis compounds and alloys in AlInGaN system on which have low dislocations and structural defects densities in layers on LANGASITE (a-$La_3Ga_5SiO_{14}$) substrates instead substrates made of other known materials to use these A3N-structures in design and manufacturing light-emitting diodes and lasers. The properties of $A^3N$ materials and langasite are presented in Table 1.

According to the first aspect of the invention a method of growth in which for decreasing dislocations density at the interface "the first epitaxial $Al_xGa_{1-x}N$ layer—the substrate" and in other functional layers of light-emitting heterostructure a-langasite substrate is used. Mismatch of c-lattice parameters of the substrate and the first epitaxial $Al_xGa_{1-x}N$ layer is no more than within the limits from −2.3% at x=1 up to +1.7% at x=0, and mismatch of their thermal expansion coefficients in the direction along the c-axis is no more than within the limits from +46% at x=1 up to −15% at x=0. Thus, there are particular x-values at which mismatch of c-lattice parameters of the substrate and the first epitaxial $Al_xGa_{1-x}N$ layer and mismatch of their thermal expansion coefficients in the direction along the c-axis are absent (Table 1).

In conformity with the second aspect of the invention, for manufacturing a "white color heterostructure with built-in phosphor" the langasite substrate is doped by special impurities to convert part of the primary dark blue radiation of the $A^3N$ heterostructure ($\lambda_{MAX}$=455 nm) into yellow radiation of the substrate, thus the substrate structure corresponds to formula $La_{3-x-y}Ce_xPr_yGa_5SiO_{14}$.

According to the third aspect of the invention, a topology of the langasite substrate and a design of the emitter chip are offered, at that all dark blue radiation of heterostructure is directed into the substrate to increase radiation power and to achieve uniform spatial distribution of color temperature of white radiation.

| Physical Properties | A³N type nitrides | | | | Langasite La₃Ga₅SiO₁₄ |
| --- | --- | --- | --- | --- | --- |
| | AlN | GaN | InN | Al$_{0.44}$Ga$_{0.56}$N | |
| Crystal Structure | wurtzite | wurtzite | wurtzite | wurtzite | Trigonal Group P321 |
| Lattice constant a, Å (direction perpendicular to c-axis) | 3.112 | 3.189 | 3.548 | 3.155 | 8.173 |
| Lattice constant a, Å (direction perpendicular to c-axis) | 4.982 | 5.185 | 5.760 | 5.099 | 5.099 |
| Ratio of lattice constants $C_{A3N}/C_{La3Ga5SiO14}$ | 0.977 (−2.3%) | 1.017 (+1.7%) | 1.130 (+13%) | 1.00 (0%) | — |
| Thermal expansion (Δc/c), K⁻¹ (direction parallel to c-axis) | $5.3 \times 10^{-6}$ | $3.17 \times 10^{-6}$ | $3.0 \times 10^{-6}$ | $4.11 \times 10^{-6}$ | $3.56 \times 10^{-6}$ |
| Thermal expansion (Δa/a), K⁻¹ (direction parallel to c-axis) | $4.2 \times 10^{-6}$ | $5.59 \times 10^{-6}$ | $4.0 \times 10^{-6}$ | $4.98 \times 10^{-6}$ | $5.11 \times 10^{-6}$ |
| Ratio of thermal expansion coefficients (Δc/c)$_{A3N}$/(Δc/c)$_{La3Ga5SiO14}$ (direction parallel to c-axis) | 1.49 (+49%) | 0.89 (−11%) | 0.84 (−16%) | 1.15 (+15%) | — |

BRIEF DESCRIPTION OF THE DRAWINGS

The drawings included in this application provide detailed description of advantages of the invention and help to understand its essence. Similar reference numbers represent corresponding parts throughout.

DETAILED DESCRIPTION OF THE ILLUSTRATED EMBODIMENTS

Figure 1:
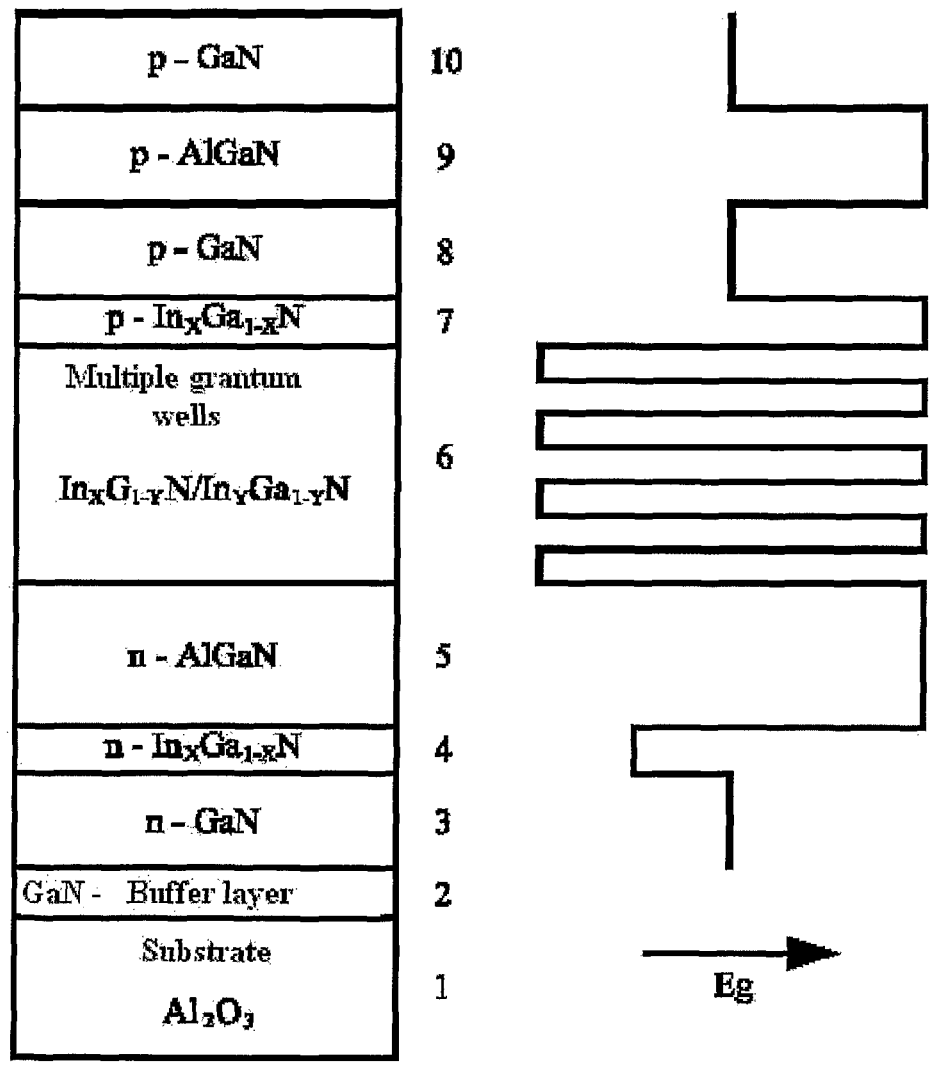
FIG. 1 is a drawing of a polar light-emitting A³N-heterostructure grown by a usual method of epitaxy-prototype [2].

The present invention is described below with references to drawings. FIG. 1 represents a typical light-emitting diode hetero structure and changing bandgap energy in hetero structure layers corresponding to prototypes; U.S. Pat. No. 5,290,393, issued to Nakamura; U.S. Pat. No. 5,993,542, issued to Yanashima; U.S. Pat. No. 5,909,036, issued to Tanakana. This heterostructure contains an additional n-In$_x$Ga$_{1-x}$N layer (4) grown to prevent cracking a following n-AlGaN (5) emitter layer which is grown before a multiple quantum wells In$_x$Ga$_{1-x}$N/In$_y$Ga$_{1-y}$N active layer (6).

Figure 2:
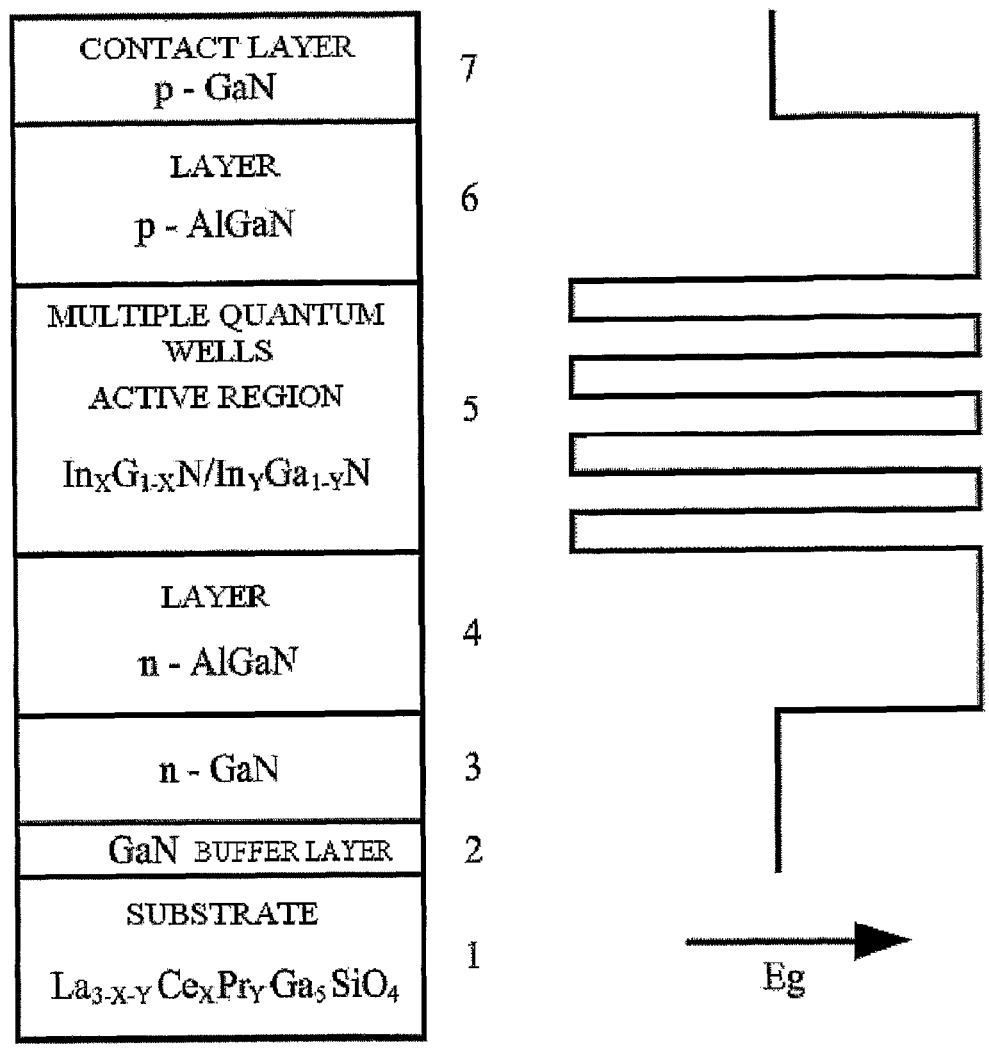
FIG. 2 is a drawing of a non-polar light-emitting A³N-heterostructure grown on a langasite substrate.

FIG. 2 represents a light-emitting diode heterostructure, grown on a langasite substrate. A profile of changing bandgap energy in different heterostructure layers is also shown. Unlike the structure represented in FIG. 1 in the offered structure the n-In$_x$Ga$_{1-x}$N layer (4) and the p-GaN layer (8) are not grown. The p-GaN layer (8) is a wave guiding layer which is most effectively used in laser diodes, not in light-emitting diodes. For growth of a light-emitting diode heterostructure a langasite substrate (1) having the a-plane orientation and perfect surface treatment (Ra<0.5 nm) is loaded into a reactor of an OMVPE apparatus in very clean nitrogen atmosphere conditions. After blowing through the reactor by pure nitrogen hydrogen pressure in the reactor decreases to an operating level nearby 70 Torr. Then the graphite susceptor with the substrate are heated up to 1050° C. After heating during 15 min at hydrogen flow rate of 15 litre/min ammonia with flow rate of 5 litre/min is supplied into the reactor. In this condition the process is sustained for 5 minutes. After that high-frequency heating power is decreased and within 6 minutes the temperature of the susceptor is stabilized at the level 530° C.

Then, to grow up a GaN buffer layer (2) trimethylgallium (TMG), as the source gas, with flow rate of $4*10^{-5}$ mol/min is supplied through separate injection nozzle into the reactor for 50 seconds. As a result, the GaN buffer layer with thickness of 15 nm is grown. After that, the susceptor temperature is very rapidly risen up to 1030° C. and TMG with silane (SiH$_4$) used as a donor impurity source is supplied into the reactor with flow rate of $7*10^{-5}$ mol/min. The TMG+SiH$_4$ gas mixture has flow rate of experimentally selected value to have a doping level of the GaN layer about $2*10^{18}$ cm$^{-3}$. The GaN layer (3) with thickness about 3.2 microns grows for 35 minutes. Then the trimethylaluminum (TMAl) is supplied as a source gas, and its flow rate linearly increases from 0 to $1*10^{-5}$ mol/min during 5 minutes. As a result, the n-Al$_x$Ga$_{1-x}$N (x<0.15) (5) layer with thickness of 0.5 microns and with a gradient of aluminum content is grown. After that, supplying TMG, TMAl and SiH$_4$ is stopped, the susceptor temperature has been very rapidly reduced down to 860° C. during 5 minutes. Now, submission of TMG and trimethylindium (TMI) is switched on and growth of In$_x$Ga$_{1-x}$N/In$_y$Ga$_{1-y}$N layers (6) forming a multiple quantum wells structure occurs by periodically switching TMI flow rates between $7*10^{-6}$ mol/min and $3*10^{-5}$ mol/min. Duration of TMI submission with the higher flow rate takes of 3 seconds and with the lower flow rate of 16 seconds. Then the susceptor temperature rises up to 1030° C. during 5 minutes and TMG+TMAl flows are supplied into the reactor again. During growth of AlGaN (9) and GaN (10) layers bis(cyclopentadienyl)magnesium (Cp$_2$Mg) as a source of acceptor impurity is supplied into the reactor. The Cp$_2$Mg flow rate must be high enough to obtain the acceptor concentration of the order $3*10^{18}$ cm$^{-3}$ for providing low specific resistance of the p-GaN contact layer (10).

Figure 3:
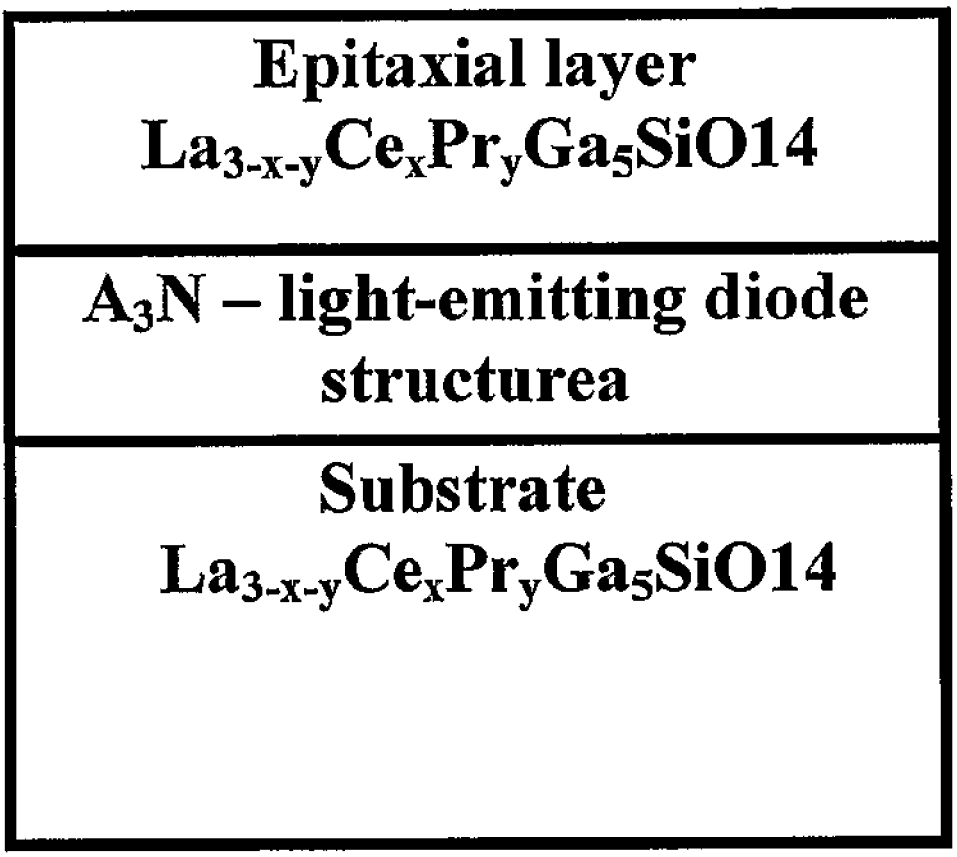
FIG. 3 is a schematic view of a light-emitting heterostructure on a langasite substrate with an additional Ce- and Pr-doped langasite layer grown on the surface of the A³N-heterostructure.

In FIG. 3 a design of an emitter for a white light-emitting diode is represented. The emitter consists of a hetero structure radiating in dark blue part of spectrum whose layers (2)-(10), according to the invention, are grown on a-langasite substrate by selective OMVPE epitaxy. The langasite composition is described by formula La$_{3-x-y}$Ce$_x$Pr$_y$Ga$_5$SiO$_{14}$. There are specially prepared recesses in the substrate for selective hetero structure epitaxy. Before the final operation of separating a wafer into chips there are made a number of technological operations: photolithography, removal of layers (6), (9) and (10) from part of the selectively grown hetero structure by etching, deposition of the reflecting coating (11) consisting of thin layers of nickel and gold, and deposition of the ohmic contact (12) layer consisting of the tin-gold alloy which is needed for the subsequent mounting the emitter on the base of a light-emitting diode. Absorption of the dark blue radiation of the hetero structure excites yellow photoluminescence in the substrate, caused by presence of Ce and Pr in langasite. Effective transformation of part of dark blue radiation into yellow is provided with absence of air interlayer between the selectively grown hetero structure and langasite surrounding it from the all directions. As a result, due to mixture of dark blue and yellow radiation the emitter generates white light.

Figure 4:
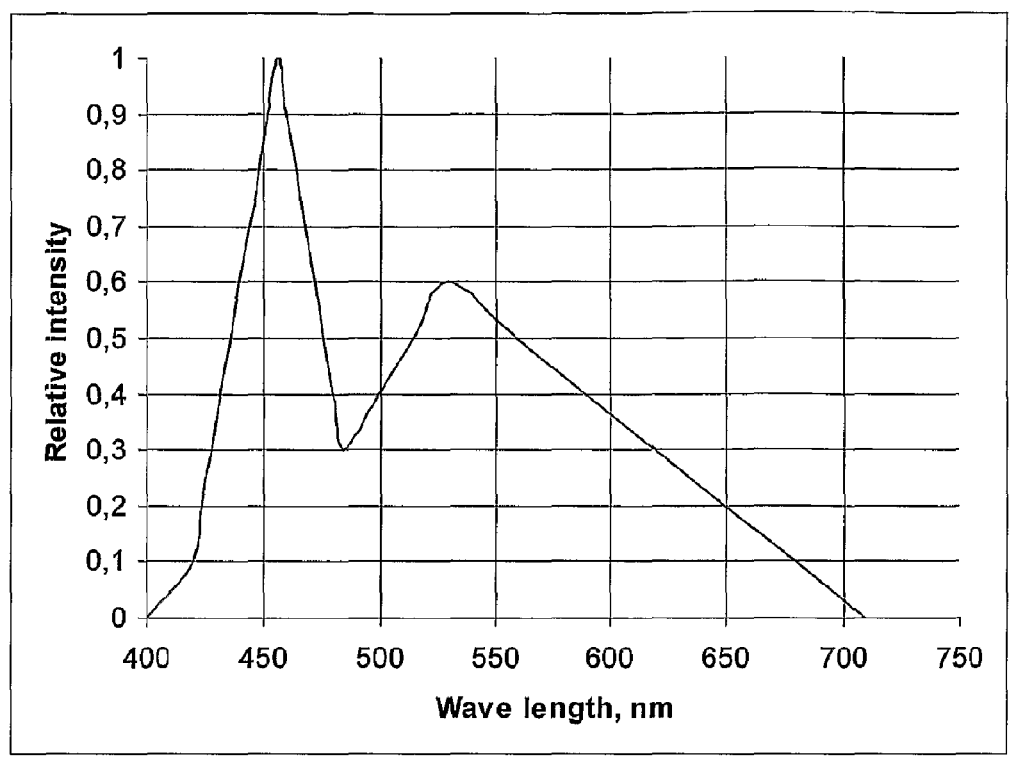
FIG. 4 represents an emission spectrum produced by the light-emitting diode on the Ce- and Pr-doped langasite substrate.

In FIG. 4 a typical design of a white light-emitting diode (prototype) is represented in which a dark blue color emitter (13) is used covered by usual Yttrium-Aluminum-Garnet phosphor (14).

INDUSTRIAL APPLICABILITY $A^3N$-heterostructures on a-plane langasite substrates grown by the method proposed in the invention have lower density of defects than structures by usual methods and have no microcracks. The dislocation density in hetero structures represented in the FIG. 2 may have values less than $5*10^7$ cm$^{-2}$, Emitters have white color of light with chromatic coordinates X=0.31, Y=0.31.

[1] SU No. 635813, 7 Aug. 1978
[2] U.S. Pat. No. 5,998,925, 7 Dec. 1999.
[3] M. Craven at el, Dislocation reduction in non-polar gallium nitride thin films, International Appl. No. PCT/US03/11177, 15 Apr. 2003.
[4] Sh. Nakamura, Growth and device strategies for AlGaN-based UV emitters, UCSB, 2004.

What is claimed is:

1. A light-emitting diode, comprising:
    a $A^3N$ heterostructure layer comprising the formula $Al_xGa_{1-x}N$ ($0<x\leq1$) arranged on a substrate; and
    a phosphor-doped (a)-langasite layer arranged on the surface of the at least one $A^3N$ heterostructure opposite to the substrate.

2. The light-emitting diode of claim 1, wherein the substrate comprises an (a)-plane substrate.

3. The light-emitting diode of claim 2, further comprising a GaN buffer layer arranged on the (a)-plane substrate,
    wherein the substrate comprises an (a)-langasite ($La_3Ga_5SiO_{14}$) substrate.

4. The light-emitting diode of claim 3, wherein the (a)-langasite substrate comprises the formula La3-x-yCexPryGa5SiO14 (x=0.1±3%, y=0.01±1%), the (a)-langasite substrate being configured to transform a part of blue wavelength light emitted by the at least one A3N heterostructure into a yellow wavelength light.

5. The light-emitting diode of claim 2, wherein the (a)-plane substrate is phosphor doped, the phosphor doped (a)-plane substrate being configured to transform ultraviolet wavelength light into visible wavelength light, including white light.

6. The light-emitting diode of claim 2, wherein the (a)-plane substrate comprises a Ce-doped or a Pr-doped langasite buffer layer arranged on a material of the group comprising at least one of Si, Al2O3, Ge, or similar materials.

7. The light-emitting diode of claim 1, wherein a mismatch of lattice parameters of the substrate and the $A^3N$ heterostructure layer is between −2.3% to +1.7%.

8. The light-emitting diode of claim 1, wherein the substrate is less than or equal to 80 microns thick.

9. The light-emitting diode of claim 1, wherein the $A^3N$ heterostructure layer comprises AlN, GaN, and InN.

10. The light-emitting diode of claim 1, wherein the $A^3N$ heterostructure layer comprises a non-polar layer.

11. The light-emitting diode of claim 10, wherein the $A^3N$ heterostructure is configured to emit a green wavelength or ultraviolet wavelength light.

12. The light-emitting diode of claim 1, wherein the phosphor-doped layer comprises the formula La3-x-yCexPryGa5SiO14 (x=0.1±3%, y=0.01±1%).

* * * * *